United States Patent
Li et al.

(10) Patent No.: US 11,672,147 B2
(45) Date of Patent: Jun. 6, 2023

(54) DISPLAY SUBSTRATE, METHOD FOR MANUFACTURING DISPLAY SUBSTRATE, AND DISPLAY APPARATUS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Wei Li, Beijing (CN); Bin Zhou, Beijing (CN); Jun Liu, Beijing (CN); Ning Liu, Beijing (CN); Wei Song, Beijing (CN); Xuehai Gui, Beijing (CN); Xiaodong Zhang, Beijing (CN); Rong Liu, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 338 days.

(21) Appl. No.: 16/652,487

(22) PCT Filed: May 16, 2019

(86) PCT No.: PCT/CN2019/087208
§ 371 (c)(1),
(2) Date: Mar. 31, 2020

(87) PCT Pub. No.: WO2020/228016
PCT Pub. Date: Nov. 19, 2020

(65) Prior Publication Data
US 2022/0052131 A1    Feb. 17, 2022

(51) Int. Cl.
*H01L 27/32* (2006.01)
*H01L 51/56* (2006.01)

(52) U.S. Cl.
CPC ...... *H01L 27/3246* (2013.01); *H01L 27/3283* (2013.01); *H01L 51/56* (2013.01)

(58) Field of Classification Search
CPC ............. H01L 27/3246; H01L 51/5012; H01L 51/525; H01L 2227/323; H01L 27/3283
See application file for complete search history.

(56) References Cited

U.S. PATENT DOCUMENTS

| 10,217,955 B2 | 2/2019 | Cheng et al. |
| 11,056,544 B1 * | 7/2021 | Wei ..................... H01L 27/3218 |

(Continued)

FOREIGN PATENT DOCUMENTS

| CN | 105826358 A | 8/2016 |
| CN | 107425032 A | 12/2017 |
| CN | 107689390 A | 2/2018 |

OTHER PUBLICATIONS

Office Action dated Mar. 24, 2022, issued in counterpart CN Application No. 201980000649.4 with Englsih translation. (16 pages).

(Continued)

*Primary Examiner* — Jaehwan Oh
(74) *Attorney, Agent, or Firm* — WHDA, LLP

(57) ABSTRACT

The present application discloses a display substrate. The display substrate may include a base substrate; a plurality of first electrodes arranged in an array on the base substrate; and a pixel defining layer defining a plurality of openings on the base substrate. The plurality of openings may overlap the plurality of first electrodes respectively. The pixel defining layer may include a plurality of first pixel defining units and a plurality of second pixel defining units; and the plurality of first pixel defining units may be separated from one another.

17 Claims, 10 Drawing Sheets

(56) References Cited

U.S. PATENT DOCUMENTS

| | | | |
|---|---|---|---|
| 2011/0127502 A1* | 6/2011 | Kim | H01L 27/3283 |
| | | | 438/34 |
| 2016/0247862 A1* | 8/2016 | Song | H01L 51/5012 |
| 2019/0267437 A1* | 8/2019 | Hou | H01L 51/5012 |
| 2022/0052130 A1* | 2/2022 | Gao | H01L 27/3272 |

OTHER PUBLICATIONS

International Search Report dated Feb. 3, 2020, issued in Application No. PCT/CN2019/087208 (9 pages).

* cited by examiner forming a first electrode film 201 on the base substrate 100

↓ forming a first pixel defining layer film 211 on the first electrode film 201

↓ forming a second pixel defining layer film 212 over the plurality of first pixel defining units 111

Fig. 9

DISPLAY SUBSTRATE, METHOD FOR MANUFACTURING DISPLAY SUBSTRATE, AND DISPLAY APPARATUS

TECHNICAL FIELD

The present disclosure relates generally to the field of display technology, more particularly, to a display substrate, a display apparatus, and a method of fabricating a display substrate.

BACKGROUND

Organic light-emitting diode (OLED) has become very popular in display technology. Organic light-emitting diode (OLED) is a type of organic thin film electroluminescent component, and has advantages such as simple manufacturing process, low cost, high luminous efficiency, and capability of forming flexible structures.

At present, there are mainly two methods for forming an OLED. One method is a deposition process, which is most suitable for the manufacturing of a small-sized OLED. Currently, this first method has entered the stage of mass production.

Another method is a solution process, which mainly employs an organic solution to form a film through techniques such as spin coating, inkjet printing, or screen printing. This second method has the advantages such as low cost, high production capacity, and suitability for large-sized panels, and as such has been widely researched domestically and internationally. Among the above techniques for manufacturing OLED films via the solution process, the inkjet printing technology is a promising approach for the mass production of large-sized OLED panels because of its relatively high material utilization rate.

SUMMARY

In one aspect, the present disclosure provides a display substrate comprising: a base substrate; a plurality of first electrodes arranged in an array on the base substrate; and a pixel defining layer defining a plurality of openings on the base substrate. The plurality of openings overlap the plurality of first electrodes respectively. The pixel defining layer includes a plurality of first pixel defining units and a plurality of second pixel defining units; and the plurality of first pixel defining units are separated from one another.

In some embodiments of the present disclosure, one of the plurality of first pixel defining units has a hydrophilic side surface; one of the plurality of second pixel defining units has a hydrophobic side surface; the hydrophilic side surface and the hydrophobic side surface face a same opening, and the hydrophilic side surface is between the base substrate and the hydrophobic side surface.

In some embodiments of the present disclosure, orthographic projections of the plurality of first pixel defining units on the base substrate overlap orthographic projections of the plurality of first electrodes on the base substrate respectively.

In some embodiments of the present disclosure, orthographic projections of the plurality of first pixel defining units on the base substrate fall within the orthographic projections of the first electrodes on the base substrate respectively.

In some embodiments of the present disclosure, the plurality of first pixel defining units are separated from one another by the plurality of second pixel defining units.

In some embodiments of the present disclosure, orthographic projection of one of the plurality of first pixel defining units on the base substrate encloses a first opening area.

In some embodiments of the present disclosure, the plurality of second pixel defining units are directly in contact with one another.

In some embodiments of the present disclosure, orthographic projection of one of the plurality of second pixel defining units on the base substrate encloses a second opening area.

In some embodiments of the present disclosure, an area of the first opening area is smaller than or substantially equal to an area of the second opening area.

In some embodiments of the present disclosure, the plurality of first pixel defining units comprises a hydrophilic material and the plurality of second pixel defining units comprises a hydrophobic material.

In some embodiments of the present disclosure, a maximum distance from a point on the hydrophilic side surface to the first electrode is in a range of about 0.5 μm to about 2 μm.

In some embodiments of the present disclosure, a maximum distance from a point on the hydrophobic side surface to the first electrode is in a range of about 0.6 μm to about 4 μm.

In another aspect, the present disclosure provides a method for manufacturing a display substrate, comprising: forming a plurality of first pixel defining layer sub-films on a plurality of first electrodes respectively on a base substrate by a patterning process, the plurality of first electrodes being arranged in an array; forming a plurality of first pixel defining layer units and a plurality of second pixel defining layer units, wherein the first pixel defining layer units are separate from one another.

In some embodiments of the present disclosure, forming the plurality of first pixel defining layer sub-films on the plurality of first electrodes respectively on the base substrate by a patterning process comprises: forming a first electrode film on the base substrate; forming a first pixel defining layer film on the first electrode film; patterning the first electrode film and the first pixel defining layer film to form the plurality of first pixel defining layer sub-films on the plurality of first electrodes respectively on the base substrate with a first mask.

In some embodiments of the present disclosure, forming the plurality of first pixel defining layer units and the plurality of second pixel defining layer units comprises: forming a second pixel defining layer film covering the plurality of first pixel defining sub-films; patterning the second pixel defining layer film and the plurality of first pixel defining layer sub-films with a second mask to form the plurality of first pixel defining layer units and the plurality of second pixel defining layer units, wherein at least one of the plurality of first pixel defining layer units comprises a hydrophilic side surface, and at least one of the plurality of second pixel defining layer units comprises a hydrophobic side surface.

In some embodiments of the present disclosure, forming the plurality of first pixel defining layer units and the plurality of second pixel defining layer units comprises: forming a second pixel defining layer film; patterning the second pixel defining layer film and the plurality of first pixel defining layer sub-films with two different masks to form the plurality of first pixel defining layer units and the plurality of second pixel defining layer units; wherein at least one of the plurality of first pixel defining layer units comprises a hydrophilic side surface, and at least one of the plurality of second pixel defining layer units comprises a hydrophobic side surface.

In some embodiments of the present disclosure, the plurality of first pixel defining layer units and the plurality of second pixel defining layer units define a plurality of openings; the plurality of openings overlap the plurality of first electrodes respectively.

In some embodiments of the present disclosure, the method further comprises: forming an organic emitting solution in the plurality of openings so that the organic emitting solution is in contact with both the hydrophilic side surface and the hydrophobic side surface; drying the organic emitting solution to form an organic emitting layer.

In another aspect, the present disclosure provides a display apparatus, comprising: any one of the display substrates described above; an organic emitting layer in at least one of the plurality of openings; and a second electrode on the organic emitting layer.

In some embodiments of the present disclosure, a thickness of the organic emitting layer is smaller than or substantially the same as the maximum vertical distance from the point on the hydrophilic side surface to the first electrode.

BRIEF DESCRIPTION OF THE FIGURES

In order to clearly illustrate various embodiments in the invention disclosed herein, the following are accompanying drawings in the description of the embodiments, which are introduced briefly herein.

The following drawings are merely examples for illustrative purposes according to various disclosed embodiments and are not intended to limit the scope of the present invention.

FIG. 2-1 is a schematic diagram illustrating a cross section of A-A' in FIG. 1;

FIG. 2-2 is a schematic diagram illustrating a plan view of one of the plurality of first pixel defining units and one of the plurality of second pixel defining units according to some embodiments of the present disclosure;

FIG. 3-1 is a schematic diagram of a display substrate according to some embodiments of the present disclosure;

FIG. 3-2 is a schematic diagram illustrating a plan view of one of the plurality of first pixel defining units and one of the plurality of second pixel defining units according to some embodiments of the present disclosure;

FIG. 4-1 is a schematic diagram of a display substrate according to some embodiments of the present disclosure;

FIG. 4-2 is a schematic diagram illustrating a plan view of one of the plurality of first pixel defining units and one of the plurality of second pixel defining units according to some embodiments of the present disclosure;

FIG. 5-1 to FIG. 5-6 illustrate a method of fabricating a display substrate according to some embodiments of the present disclosure;

FIG. 6-1 to FIG. 6-6 illustrate a method of fabricating a display substrate according to some embodiments of the present disclosure;

FIG. 7-1 to FIG. 7-3 illustrate a method of fabricating a display apparatus according to some embodiments of the present disclosure;

FIG. 9 illustrate a flow chart of fabricating a display substrate according to some embodiments of the present disclosure.

DETAILED DESCRIPTION

Figure 1:
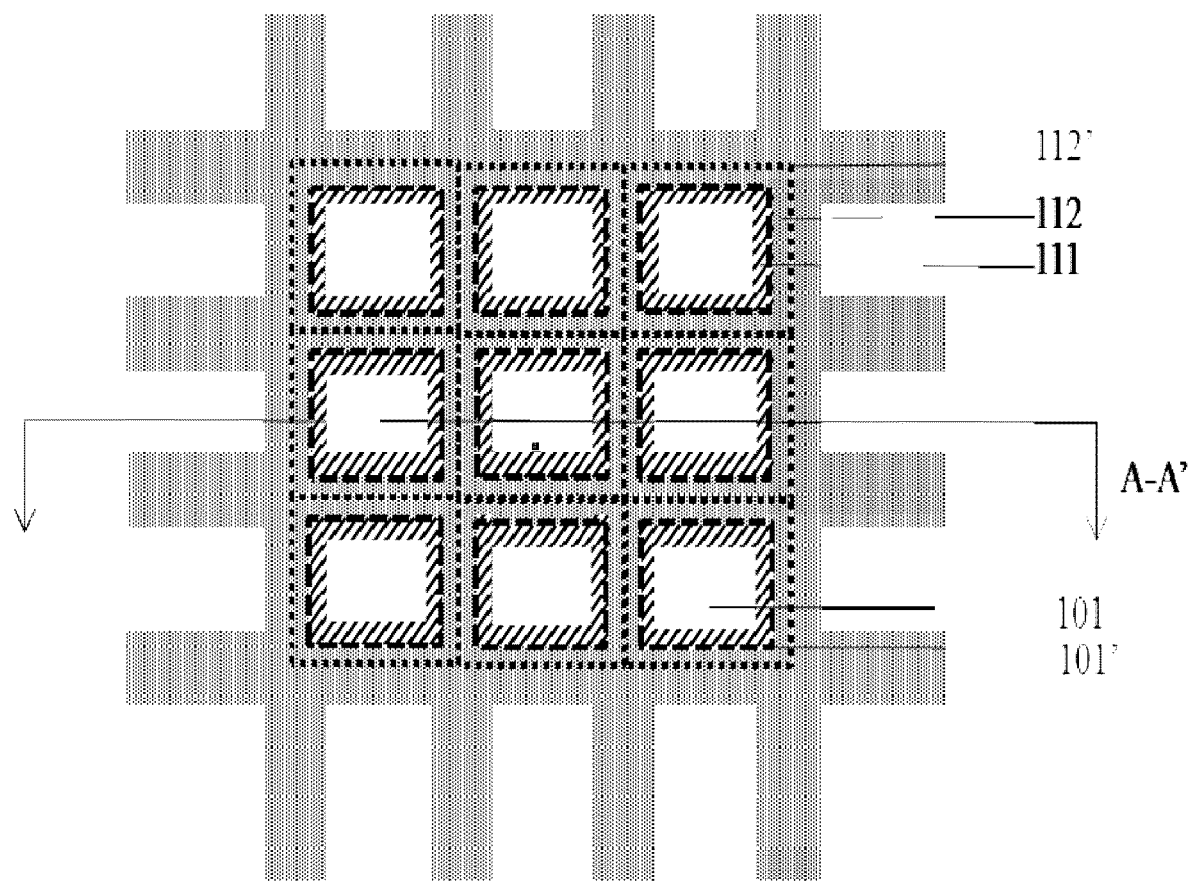
FIG. 1 is a schematic diagram illustrating the structure of a display substrate according to some embodiments of the present disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-9. When referring to the figures, like structures and elements shown throughout are indicated with like reference numerals.

It is noted that these drawings shall be regarded to represent only some, but not all, of the embodiments of the present disclosure. For those skilled in the art, other embodiments may become apparent based on the structures as illustrated in these accompanying drawings.

A numerical value modified by "about" herein means that the numerical value can vary by 10% thereof.

In inkjet printing technologies for manufacturing an OLED film in an OLED display panel, ink droplets are printed into a plurality of openings formed by a pixel defining layer (PDL). The PDL typically has a hydrophilic side. Thus, during a drying process, the ink droplets can climb along edges of the openings L, thereby forming an uneven film that is thick at the edge and thin in the middle in each of the openings. This often negatively affects the photochromic effect or the light-emitting effect of the emitting layer (EL) and shortens working life of the display component.

Accordingly, the present disclosure provides, inter alia, a display substrate, a display apparatus, and a method of fabricating a display substrate that substantially obviate one or more of the problems of the related art. In one embodiment, the present disclosure provides a display substrate. The display substrate includes a base substrate; a plurality of first electrodes arranged in an array on the base substrate; and a pixel defining layer defining a plurality of openings on the base substrate. The plurality of openings overlap the plurality of first electrodes respectively. The pixel defining layer includes a plurality of first pixel defining units and a plurality of second pixel defining units; and the plurality of first pixel defining units are separated from one another.

Figures 1, 2:
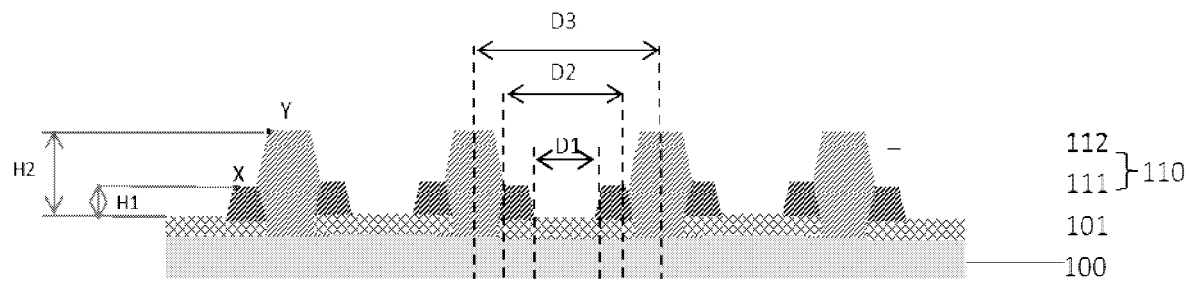
Figure 2:
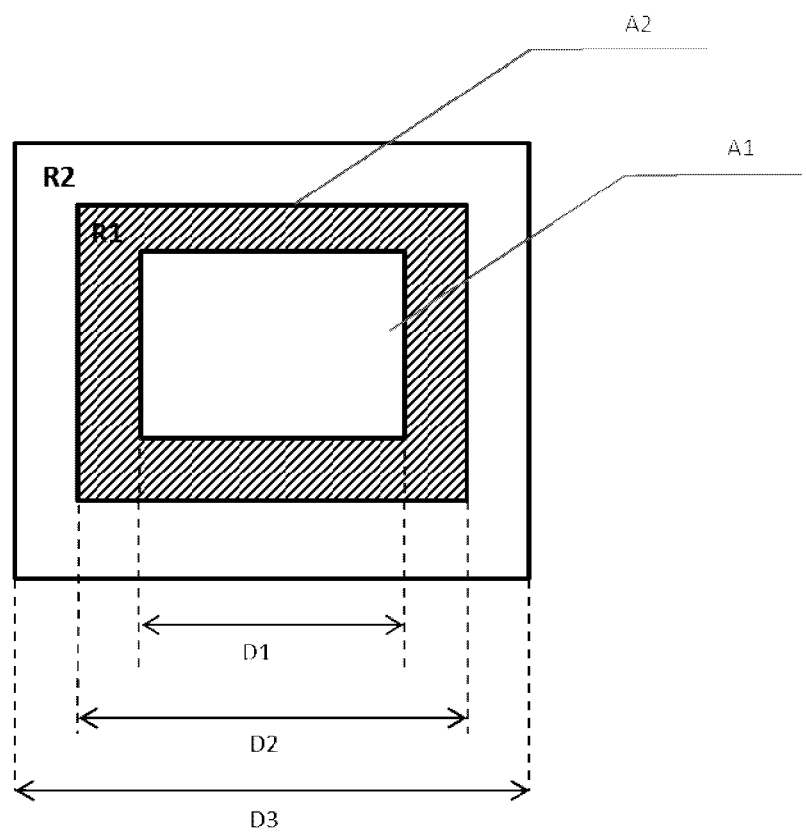

FIG. 1 is a plan view of a display substrate according to one embodiment of the present disclosure. FIG. 2-1 shows a cross-sectional view of the display substrate of FIG. 1 along line A-A'. As shown in FIG. 1 and FIG. 2-1, the display substrate includes a base substrate 100; a plurality of first electrodes 101 arranged in an array on the base substrate 100; and a pixel defining layer 110 defining a plurality of openings A on the base substrate 100. The plurality of openings overlap the plurality of first electrodes 101 respectively. The pixel defining layer 110 includes a plurality of first pixel defining units 111 and a plurality of second pixel defining units 112; and the plurality of first pixel defining units 111 are separated from one another. "Separated from one another" here means that the plurality of first pixel defining units 111 are not directly in physical contact with one another. However, the plurality of first pixel defining units may be indirectly in physical contact with one another, for example, through an intermediary. "The plurality of openings overlap the plurality of first electrodes 101 respectively" herein means that orthographic projections of the plurality of openings on the base substrate overlap orthographic projections of the plurality of first electrodes on the base substrate respectively. In some embodiments of the present disclosure, orthographic projections of the plurality of first pixel defining units 111 on the base substrate 100 overlap orthographic projections of the plurality of first electrodes 101 on the base substrate 100 respectively.

In some embodiments, as shown in FIG. 1, a boundary of one of the first electrodes 101 is shown in a broken line 101'. The plurality of first electrodes 101 on the base substrate 100 are separated from one another.

As illustrated in FIG. 1 and FIG. 2-1, in some embodiments, the plurality of first pixel defining units 111 and the plurality of second pixel defining units 112 define a plurality of openings. Orthographic projections of the plurality of first pixel defining units 111 on the base substrate 100 fall within the orthographic projections of the first electrodes 101 on the base substrate 100 respectively. In some embodiments of the present disclosure, the plurality of first electrodes 101 on the base substrate 100 are separated from one another by the plurality of second pixel defining units 112.

In some embodiments, at least one of the plurality of first pixel defining units 111 has a hydrophilic side surface S1. At least one of the plurality of second pixel defining units 112 has a hydrophobic side surface S2. The hydrophilic side surface S1 and the hydrophobic side surface S2 face a same opening A. The hydrophilic side surface S1 is between the base substrate 100 and the hydrophobic side surface S2.

In some embodiments of the present disclosure, the plurality of first pixel defining units 111 are separated from one another by the plurality of second pixel defining units 112.

In some embodiments of the present disclosure, the plurality of first pixel defining units 111 are directly in physical contact with the plurality of first electrodes 101.

FIG. 2-2 shows orthographic projections of a first pixel defining unit 111 and a second pixel defining unit 112 on the base substrate 100. In some embodiments, an orthographic projection of one of the plurality of first pixel defining units 111 on the base substrate 100 encloses a first opening area A1. In some embodiments, an orthographic projection of each of the plurality of first pixel defining units 111 on the base substrate 100 encloses a first opening area A1.

In some embodiments, an orthographic projection of one of the plurality of second pixel defining units 112 on the base substrate 100 encloses a second opening area A2. In some embodiments, an orthographic projection of each of the plurality of second pixel defining units 112 on the base substrate 100 encloses a second opening area A2.

As illustrated in FIG. 2-2, in some embodiments, the first opening area A1 is smaller than or substantially equal to the second opening area A2.

As illustrated in FIG. 2-2, in some embodiments, the orthographic projection of one of the plurality of first pixel defining units 111 on the base substrate 100 is a first frame R1. The first frame may have a rectangular shape or a square shape.

In some embodiments, the orthographic projection of one of the plurality of second pixel defining units 112 on the base substrate 100 is a second frame R2. The second frame may have a rectangular shape or a square shape.

In some embodiments, a plurality of first frames R1 and a plurality of second frames R2 arrange in an array.

In some embodiments, the plurality of second frames R2 are directly in physical contact with each other.

In some embodiments, the first opening area A1 is a rectangle and the second opening area A2 is a rectangle. In some embodiments, the first opening area A1 is a square and the second opening area A2 is a square.

In some embodiments of the present disclosure, an outer contour shape of one of the plurality of second pixel defining units 112 is a rectangle or a square.

Herein, the term "rectangular," and "rectangle" could be not exactly a rectangular shape due to some process errors. For example, a angle formed by two sides of the rectangular shape or the rectangle may vary by about 10% around the right angle. In some embodiments, the rectangular shape may have chamfers.

In some embodiments, the orthographic projection of one of the plurality of first pixel defining units 111 on the base substrate 100 and the orthographic projection of one of the plurality of second pixel defining units 112 on the base substrate 100 could be other shape such as circle, triangle, square or trapezoid; or substantially as circle, triangle, square or trapezoid due to some process errors.

In some embodiments of the present disclosure, the first opening area A1 and the second opening area A2 could be other shape such as circle, triangle, square or trapezoid; or substantially as circle, triangle, square or trapezoid due to some process errors.

In some embodiments of the present disclosure, the outer contour shape of one of the plurality of second pixel defining units 112 could be other shape such as circle, triangle, square or trapezoid; or substantially as circle, triangle, square or trapezoid due to some process errors.

In some embodiments, as illustrated in FIGS. 2-1 and 2-2, a width of the first opening area A1 is D1, a width of the second opening area A2 is D2, a width of the outer contour shape of one of the plurality of second pixel defining units 112 is D3, D1<D2<D3. That is, the side surface of the pixel defining layer facing the opening A has a stepwise structure. The hydrophilic side surface S1 of the first pixel defining unit 111 constitutes a lower step of the side surface of the pixel defining layer, and the hydrophobic side surface S2 of the second pixel defining unit 112 constitutes an upper step of the side surface of the pixel defining layer.

Figures 1, 3:
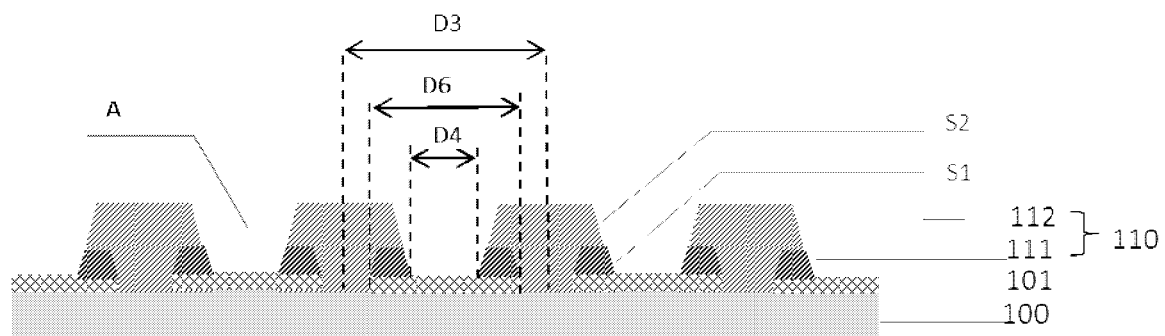
Figures 2, 3:
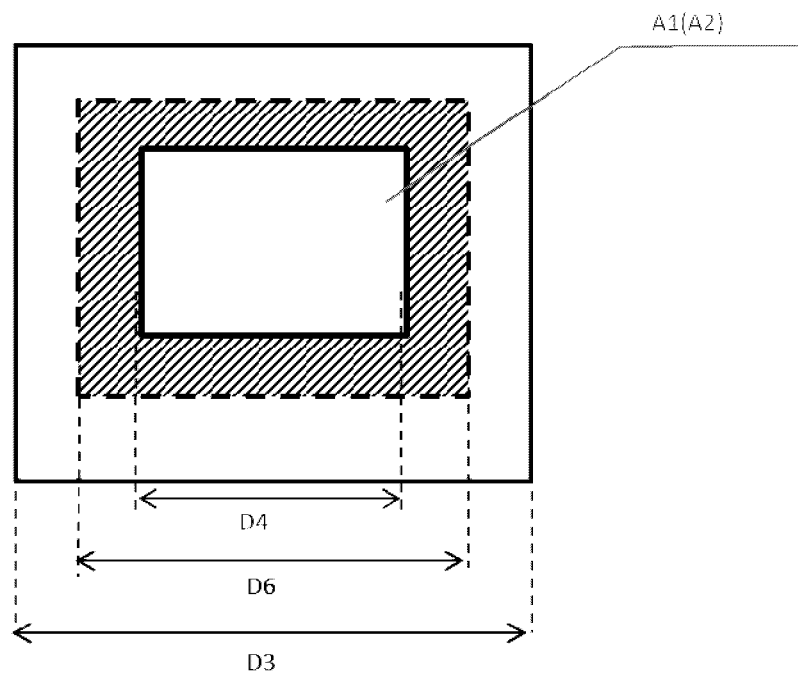

In some embodiments, as illustrated in FIGS. 3-1 and 3-2, a width of the first opening area A1 is D4, a width of the second opening area A2 is equal to or substantially equal to D4. For example, the hydrophilic side surface S1 and the hydrophobic side surface S2 are in a same surface to improve a uniformity of an organic layer formed in the opening A.

As used herein, the term "substantially equal" refers that the difference of two subject matters, such as a width, a length, an area of two objects, can vary by not more than 5% (e.g., not more than 0.5%, not more than 1%, not more than 2%, not more than 3%, not more than 4% depending on process accuracy allowed) thereof.

In some embodiments of the present disclosure, an area of the first opening area A1 is larger than the area of the second opening area A2.

Figures 1, 4:
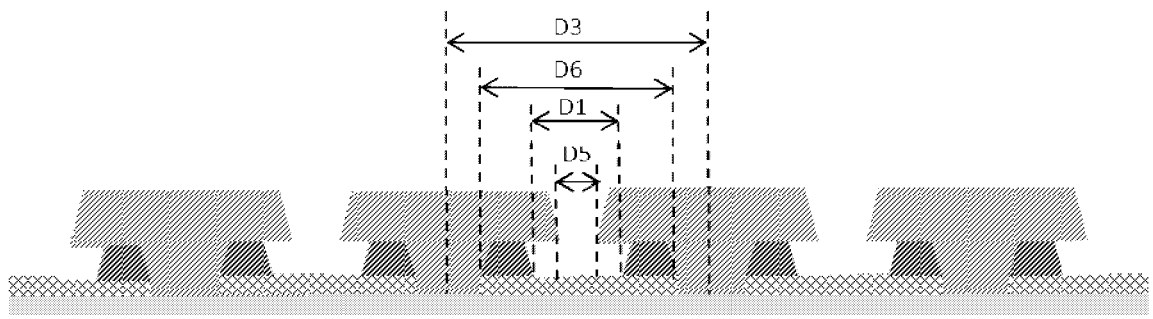
Figures 2, 4:
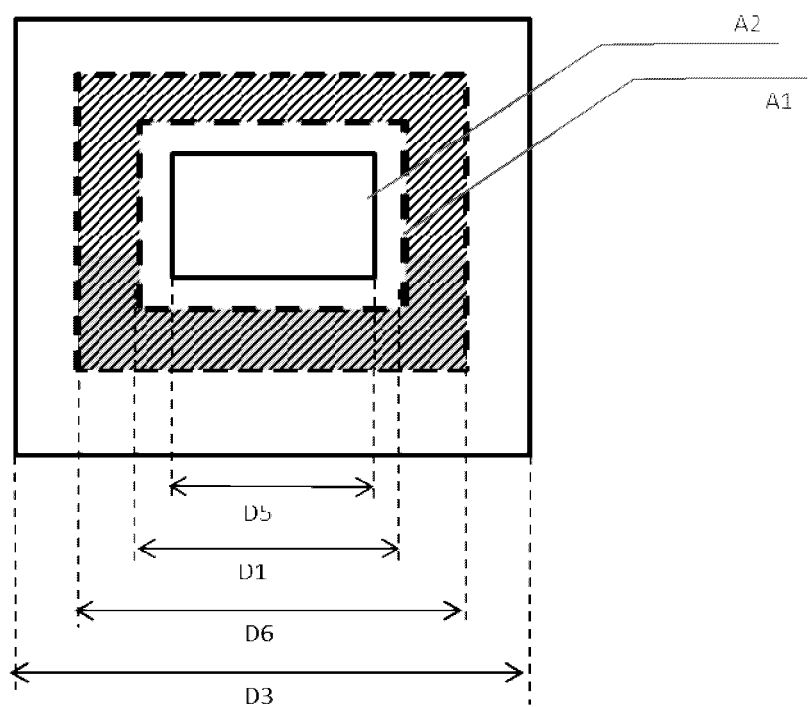

In some embodiments, as illustrated in FIGS. 4-1 and 4-2, a width of the first opening area A1 is D1, a width of the second opening area A2 is D5, D1>D5. For example, the plurality of first pixel defining units 111 are covered by the plurality of second pixel defining units 112 respectively. The side surface of the pixel defining layer facing an opening has a two layered structure. The hydrophilic side surface S1 of the first pixel defining unit constitutes a lower part of the side surface of the pixel defining layer, and the hydrophobic side surface S2 of the second pixel defining unit constitutes an upper part of the side surface of the pixel defining layer. Furthermore, the upper part of the side surface of the pixel defining layer overhangs the lower part of the side surface of the pixel defining layer. The overhanging part of the second pixel defining unit 112 could shadow a part of the organic layer near the edge of the opening A. As such, the overhanging part of the second pixel defining unit can reduce or eliminate any problem caused by non-uniformity, if any, of the organic layer near the edge of the opening A.

In some embodiments of the present disclosure, a width of an outer contour shape of one of the plurality of first pixel defining units 111 is D6. The outer contour shape of one of the plurality of first pixel defining units 111 can't be seen in a top view in FIG. 4-2, and accordingly it is shown in a dashed line.

In some embodiments of the present disclosure, the plurality of second pixel defining units 112 are directly in contact with one another.

In some embodiments, as illustrated in FIGS. 2-1, 3-1, and 4-1, the plurality of second pixel defining units 112 are directly in contact with each other, that is to say, the plurality of second pixel defining units 112 can be an integrated structure. The plurality of first pixel defining units 111 are not directly in contact with each other, that is to say, the plurality of first pixel defining units 111 are separated structures.

In some embodiments, the display substrate comprises a passivation layer (not shown in figures) between the base substrate 100 and the plurality of first electrodes 101, the plurality of second pixel defining units 112 are directly in contact with the passivation layer to enhance the contacting force. For example the passivation layer includes inorganic material such as SiNx etc.

In some embodiments of the present disclosure, the plurality of first pixel defining units 111 comprises a hydrophilic material and the plurality of second pixel defining units 112 comprises a hydrophobic material.

In some embodiments, the hydrophilic material can have a composition of a photoresist. For example, the hydrophilic material can be phenolic resin or polyimide. In some embodiments, the hydrophilic material can comprise at least one of a bisphenol A polycarbonate, a polymer whose backbone chain contains an alkyl group, or a polymer whose backbone chain contains an aromatic ring structure. Other material may also be employed.

In some embodiments, the hydrophobic material can be negative photoresist. The hydrophobic material can comprise at least one of polysiloxane, fluorine-containing polyolefin or fluorine-containing polyalkyleneoxide. It is noted that other compositions/materials can be respectively employed for the hydrophilic material sub-layer and the hydrophobic material sub-layer, and there is no limitation herein.

In some embodiments of the present disclosure, a maximum vertical distance from a point on the hydrophilic side surface to the first electrode is in a range of about 0.5 µm to about 2 µm.

In some embodiments of the present disclosure, a cross-section of the first pixel defining unit in a plane vertical to the base substrate has a shape of a trapezoid. A maximum distance H1 from the point X (see FIG. 2-1) on the hydrophilic side surface to the first electrode is in a range of about 0.5 µm to about 2 µm, such as about 0.8 µm to about 1.7 µm, or about 1 µm to about 1.5 µm.

In some embodiments of the present disclosure, a maximum distance from a point on the hydrophobic side surface to the first electrode is in a range of about 0.6 µm to about 4 µm.

In some embodiments of the present disclosure, a maximum distance H2 from the point Y (see FIG. 2-1) on the hydrophobic side surface to the first electrode is in a range of about 0.6 µm to about 4 µm, such as about 1 µm to about 1.5 µm, about 2 µm to about 2.5 µm, or about 3 µm to about 3.5 µm.

In the present disclosure, without being held to a particular theory, when forming an organic layer in the opening A, although the hydrophilic side surface may have an attractive force to the organic layer, the hydrophobic side surface may have a repulsive force to the organic layer. Under action of the two forces, the uniformity of the organic layer can be improved. Therefore the photochromic effect and/or the light-emitting effect of the organic layer can be ensured and the working life of the component can also be improved.

In another aspect, the present disclosure provides a method for manufacturing a display substrate. The method may include the following steps 1 and 2.

Step 1 includes forming a plurality of first pixel defining layer sub-films on a plurality of first electrodes respectively on a base substrate by a patterning process, the plurality of first electrodes being arranged in an array.

Step 2 includes forming a plurality of first pixel defining layer units and a plurality of second pixel defining layer units, wherein the first pixel defining layer units are separate from one another.

FIGS. 5-1~5-6 and FIG. 8 illustrates a flow chart of a method of manufacturing an array substrate according to some embodiments of the present disclosure. Some embodiments of step 1 of the method comprise the following steps S101 to S103.

Figures 1, 5:
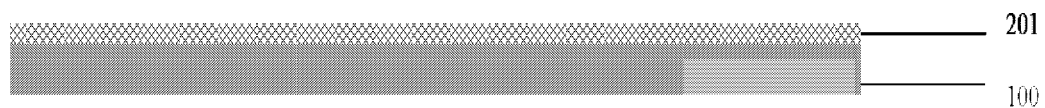
Figures 2, 5:
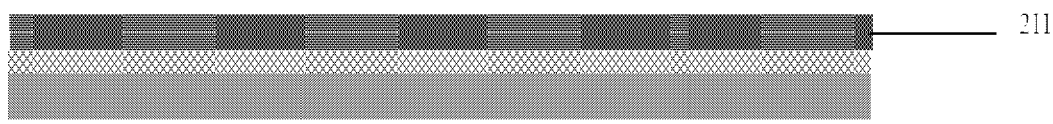
Figures 3, 5:
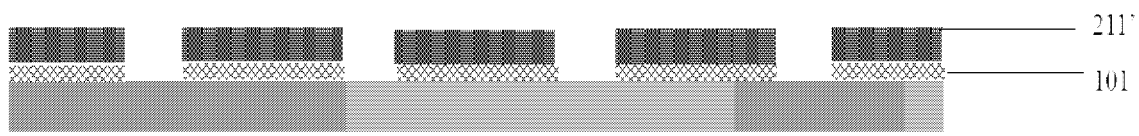
Figures 4, 5:
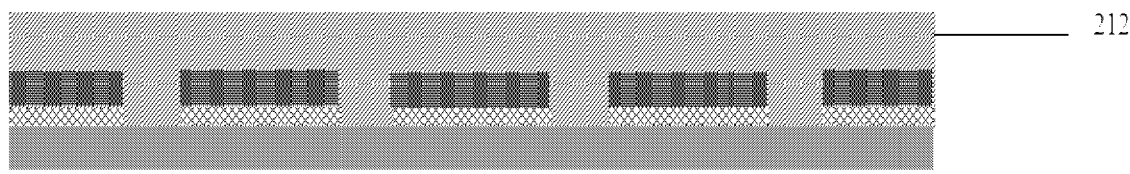
Figure 5:
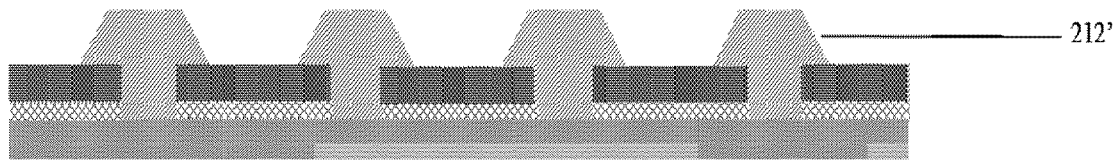

As shown in FIG. 5-1, step S101 includes forming a first electrode film 201 on the base substrate 100.

As shown in FIG. 5-2, step S102 includes forming a first pixel defining layer film 211 on the first electrode film 201.

As shown in FIG. 5-3, step S103 includes patterning the first electrode film 201 and the first pixel defining layer film 211 to form a plurality of first pixel defining layer sub-films 211' on the plurality of first electrodes 101 respectively on the base substrate 100.

Herein, in some embodiments, the first pixel defining layer film 211 has a composition of a photoresist. In some embodiments, the first pixel defining layer film 211 includes a hydrophilic material, and the hydrophilic material can be a phenolic resin or polyimide. In some embodiments, the hydrophilic material can comprise at least one of a bisphenol A polycarbonate, a polymer whose backbone chain contains an alkyl group, or a polymer whose backbone chain contains an aromatic ring structure. Other material may also be employed. Step S103 may include steps of exposing, developing and etching the first pixel defining layer film 211 and the first electrode film 201 with a first mask.

In some embodiments of the present disclosure, the Step 2 of forming the plurality of first pixel defining layer units 111 and the plurality of second pixel defining layer units 112 includes the following steps: S201 and S202.

As shown in FIG. 5-4, step S201 includes forming a second pixel defining layer film 212 covering the plurality of first pixel defining sub-films 211'. For example, the first pixel defining sub-films 211' is also used as a photoresist which can be a mask to form the plurality of first electrodes 101 and is not necessary to be stripped completely so that it can save the cost of manufacturing the array substrate.

Step S202 includes patterning the second pixel defining layer film 212 and the plurality of first pixel defining layer sub-films 211' with a second mask to form the plurality of first pixel defining layer units 111 and the plurality of second pixel defining layer units 112.

Herein, in some embodiments, the second pixel defining layer film 212 includes hydrophobic material and can be negative photoresist. The hydrophobic material can include at least one of polysiloxane, fluorine-containing polyolefin or fluorine-containing polyalkyleneoxide. It is noted that other compositions/materials can be respectively employed for the hydrophilic material in the first pixel defining layer film 211 and the hydrophobic material in the second pixel defining layer film 212, and there is no limitation herein.

In some embodiments, as shown in. FIG. 5-5, the step S202 includes using steps of exposing, developing and etching the second pixel defining layer film 212 using a second mask, to form a transitional second pixel defining layer film 212'.

Figures 5, 6:
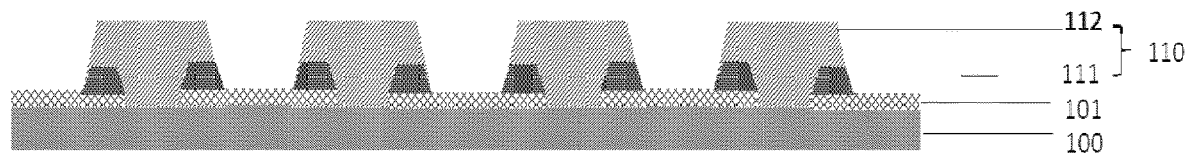
Figures 1, 6:
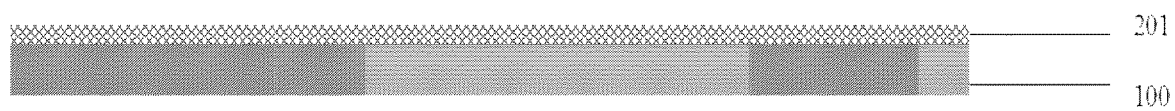
Figures 2, 6:
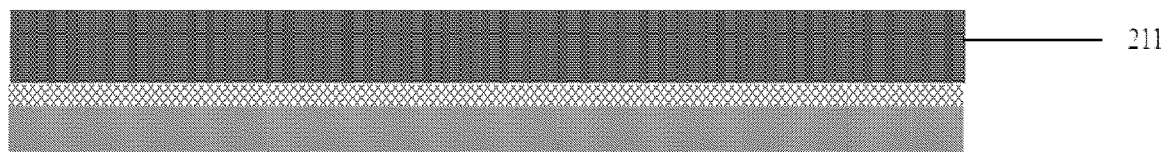
Figures 3, 6:
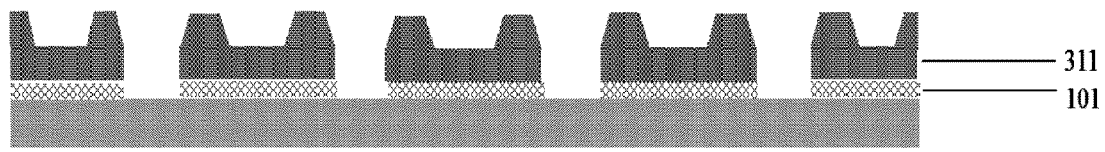
Figures 4, 6:
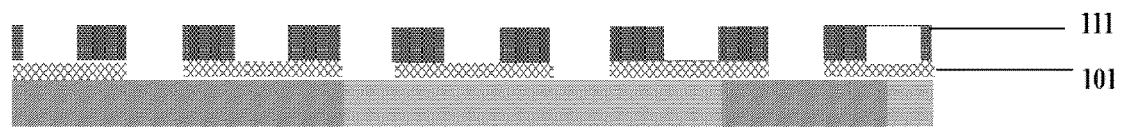
Figures 5, 6:
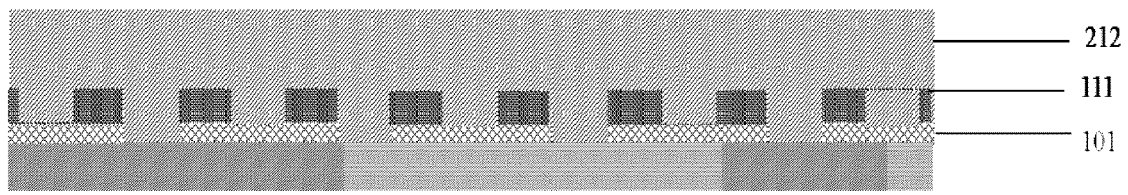
Figure 6:
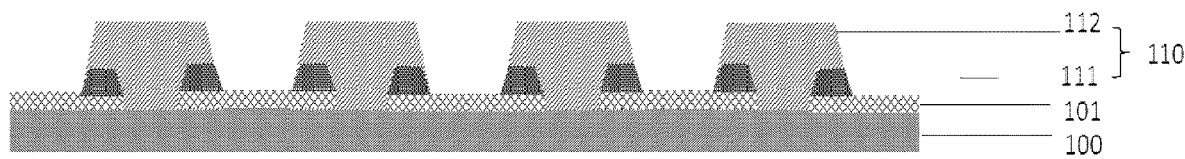

In some embodiments, as illustrated in FIG. 5-6, the step S202 further includes continuing to etch the plurality of first pixel defining layer sub-films 211' to form the plurality of first pixel defining layer units 111 and the plurality of second pixel defining layer units 112. The thickness of the second pixel defining layer units 112 can be easily controlled.

In some embodiments, as illustrated in FIG. 5-6, forming the plurality of first pixel defining layer units 111 and the plurality of second pixel defining layer units 112 may be performed through an ashing process. For example, an oxygen ashing process may be used.

In some embodiments of the present disclosure, at least one of the plurality of first pixel defining layer units 111 includes a hydrophilic side surface S1, and at least one of the plurality of second pixel defining layer units 112 includes a hydrophobic side surface S2.

For example, an oxygen ashing process may be used to improve the uniformity of the hydrophilic side surface S1 and the hydrophobic side surface S2.

FIGS. 6-1 to 6-6 show a method of manufacturing a display substrate according to some embodiments of the present disclosure. As illustrated in FIGS. 6-1~6-6, and FIG. 9 in some embodiments of the present disclosure, the method includes the following step S111 to S113.:

As shown in FIG. 6-1, step S111 includes forming a first electrode film 201 on a base substrate 100.

As shown in FIG. 6-2, step S112 includes forming a first pixel defining layer film 211 on the first electrode film 201.

As shown in FIG. 6-3, step S113 includes forming a plurality of first pixel defining layer sub-films 311 on the plurality of first electrodes 101 respectively on the base substrate 100 by a patterning process.

In some embodiments of the present disclosure, as shown in FIG. 6-3, the Step S113 includes using a halftone mask to form the plurality of first pixel defining layer sub-films 311 on the plurality of first electrodes 101 respectively on the base substrate 100.

As shown in FIG. 6-4, subsequently, a part of the plurality of first pixel defining layer sub-films 311 is etched or removed to form the plurality of first pixel defining units 111 using, for example, an ashing process.

In some embodiments of the present disclosure, the Step 2 includes the following steps S221 and S222.

As shown in FIG. 6-5, step S221 includes forming a second pixel defining layer film 212 over the plurality of first pixel defining units 111.

As shown in FIG. 6-6, Step S222 includes patterning the second pixel defining layer film 212 with a third mask to form the plurality of first pixel defining layer units 111 and the plurality of second pixel defining layer units 112.

In some embodiments of the present disclosure, the third mask is different from the halftone mask.

In some embodiments of the present disclosure, at least one of the plurality of first pixel defining layer units 111 comprises a hydrophilic side surface S1, and at least one of the plurality of second pixel defining layer units 112 comprises a hydrophobic side surface S2.

In some embodiments of the present disclosure, the plurality of first pixel defining units 111 and the plurality of second pixel defining units 112 define a plurality of openings A. The plurality of openings A overlaps the plurality of first electrodes 101 respectively.

Figures 1, 7:
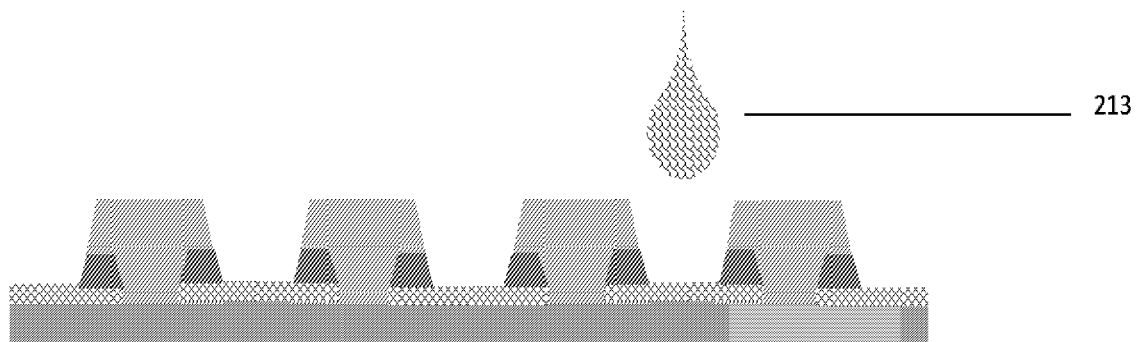
Figures 2, 7:
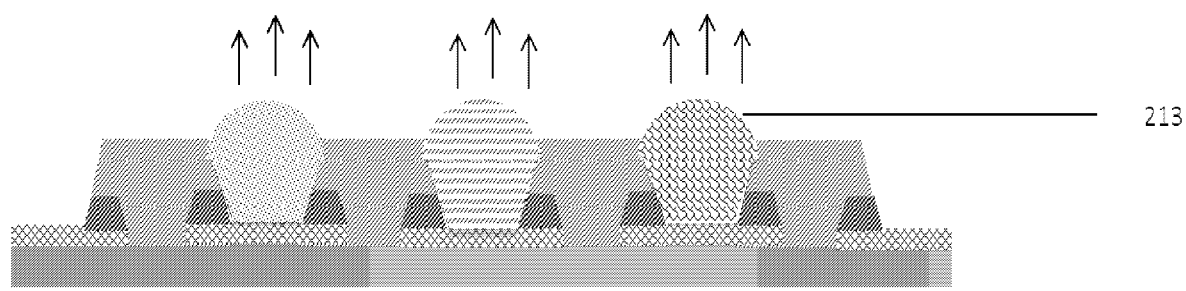
Figures 3, 7:
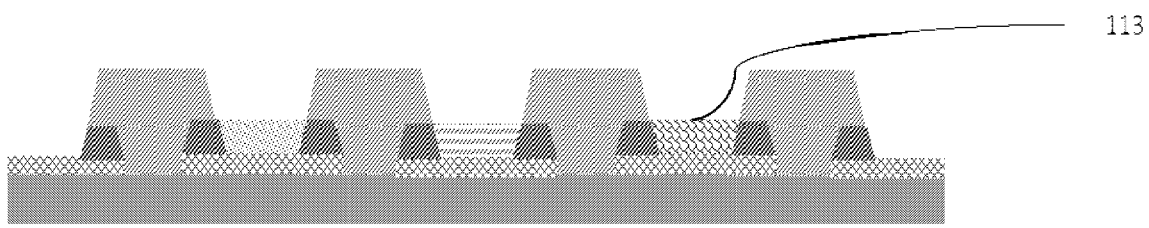
Figure 8:
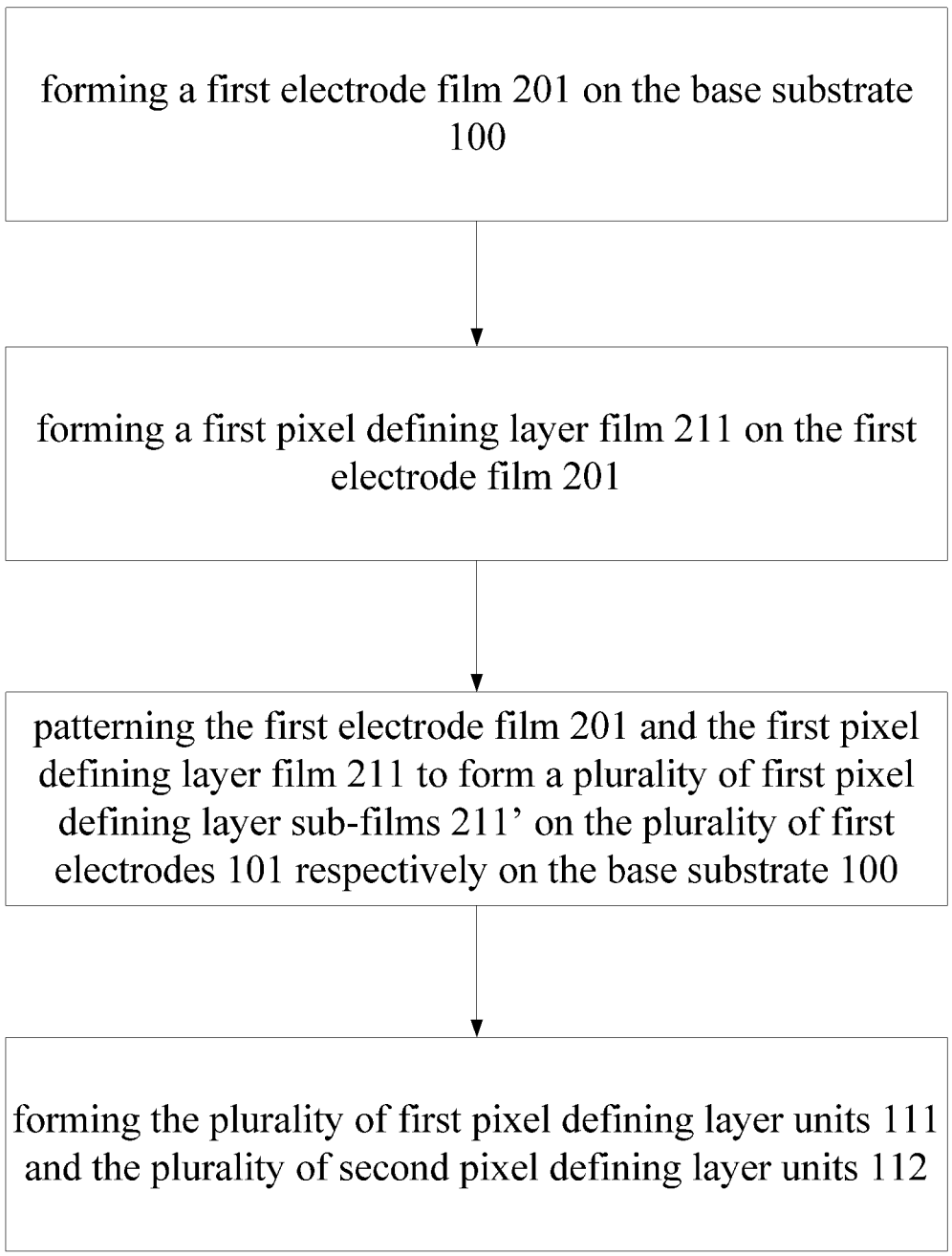
FIG. 8 illustrate a flow chart of fabricating a display substrate according to some embodiments of the present disclosure.

As shown in FIGS. 7-1~7-3, in some embodiments of the present disclosure, the method further including the following steps: 3 and 4.

As shown in FIG. 7-1, step 3 includes forming an organic emitting solution 213 in the plurality of openings A so that the organic emitting solution 213 is in contact with both the hydrophilic side surface S1 and the hydrophobic side surface S2.

As shown in FIG. 7-2, step 4 includes drying the organic emitting solution 213 to form an organic emitting layer 113.

In some embodiments of the present disclosure, forming the organic emitting solution 213 in the plurality of openings A can be performed by an inkjet printing process.

The display substrate provided in the present disclosure includes two different pixel defining units so that the uniformity of the organic layer formed in the openings of the pixel defining units can be more easily controlled. Moreover, the first pixel defining units and the first electrodes can be formed with a same mask, thereby further reducing the cost.

In another aspect, as shown in FIG. 7-3, the present disclosure provides a display apparatus which includes the display substrate according to any one of the embodiments as described above.

In some embodiments of the present disclosure, an organic emitting layer 113 is in at least one of the plurality of openings A.

In some embodiments of the present disclosure, the organic emitting layer 113 includes a red organic emitting layer or a green organic emitting layer or a blue organic emitting layer.

In some embodiments of the present disclosure, a second electrode is formed on the organic emitting layer 113.

In some embodiments of the present disclosure, the second electrodes on a plurality of organic emitting layers 113 form an integrated structure.

In some embodiments of the present disclosure, a thickness of the organic emitting layer 113 is smaller than or substantially the same as the maximum vertical distance H1 from the point on the hydrophilic side surface S1 to the first electrode 101.

The display apparatus provided in the present disclosure can be an organic electroluminescent diode (OLED) display apparatus, which comprises the aforementioned pixel defining layer 110. It further includes a plurality of structural layers for a pixel driving circuit over the base substrate 100, a plurality of organic functional layers arranged in each openings A. For example, the plurality of organic functional layers arranged in each openings A may include, along a direction away from the base substrate 100, a hole injection layer, a hole transport layer, an organic electroluminescent material layer, an electron transport layer, and an electron injection layer, and a second electrode is arranged over the plurality of organic functional layers.

In some embodiments of the present disclosure, the display apparatus, or more specifically, the organic electroluminescent diode display apparatus, can comprise other conventional structures, such as an encasing substrate that is employed to encase the array substrate, a power supply unit, or a display driving unit, etc. These conventional structures are well-known to people of skills in the field, and their description is not described herein.

The display apparatus can be any electronics product or component that has a display function, such as a mobile phone, a tablet, a television, a monitor, a laptop, a digital frame, or a navigator.

Although specific embodiments have been described above in detail, the description is merely for purposes of illustration. It should be appreciated, therefore, that many aspects described above are not intended as required or essential elements unless explicitly stated otherwise.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its practical application, thereby enabling persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims.

Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
 a base substrate;
 a plurality of first electrodes arranged in an array on the base substrate; and
 a pixel defining layer defining a plurality of openings on the base substrate; the plurality of openings overlapping the plurality of first electrodes respectively;
 wherein the pixel defining layer comprises a plurality of first pixel defining units and a plurality of second pixel defining units, and the plurality of second pixel defining units are disposed on the plurality of first pixel defining units;
 the plurality of first pixel defining units are separated from one another; and
 orthographic projections of the plurality of first pixel defining units on the base substrate fall within orthographic projections of the plurality of first electrodes on the base substrate respectively, and the plurality of second pixel defining units cover sidewalls of the plurality of first electrodes and separate adjacent first electrodes.

2. The display substrate of claim 1, wherein one of the plurality of first pixel defining units has a hydrophilic side surface;
 one of the plurality of second pixel defining units has a hydrophobic side surface;
 the hydrophilic side surface and the hydrophobic side surface face a same opening, and the hydrophilic side surface is between the base substrate and the hydrophobic side surface.

3. The display substrate of claim 1, wherein the plurality of first pixel defining units are separated from one another by the plurality of second pixel defining units.

4. The display substrate of claim 1, wherein orthographic projection of one of the plurality of first pixel defining units on the base substrate encloses a first opening area.

5. The display substrate of claim 1, wherein the plurality of second pixel defining units are directly in contact with one another.

6. The display substrate of claim 4, wherein orthographic projection of one of the plurality of second pixel defining units on the base substrate encloses a second opening area.

7. The display substrate of claim 6, wherein an area of the first opening area is smaller than or substantially equal to an area of the second opening area.

8. The display substrate of claim 1, wherein the plurality of first pixel defining units comprises a hydrophilic material and the plurality of second pixel defining units comprises a hydrophobic material.

9. The display substrate of claim 1, wherein a maximum distance from a point on the hydrophilic side surface to the first electrode is in a range of about 0.5 μm to about 2 μm.

10. The display substrate of claim 1, wherein a maximum distance from a point on the hydrophobic side surface to the first electrode is in a range of about 0.6 μm to about 4 μm.

11. A method for manufacturing a display substrate, comprising:
 forming a plurality of first pixel defining layer sub-films on a plurality of first electrodes respectively on a base substrate by a patterning process, the plurality of first electrodes being arranged in an array;
 forming a plurality of first pixel defining layer units and a plurality of second pixel defining layer units,
 wherein the plurality of first pixel defining layer units are separate from one another;
 wherein forming the plurality of first pixel defining layer sub-films on the plurality of first electrodes respectively on the base substrate by a patterning process comprises:
  forming a first electrode film on the base substrate;
  forming a first pixel defining layer film on the first electrode film;
  patterning the first electrode film and the first pixel defining layer film to form the plurality of first pixel defining layer sub-films on the plurality of first electrodes respectively on the base substrate with a first mask; and
 wherein orthographic projections of the plurality of first pixel defining layer units on the base substrate fall within orthographic projections of the plurality of first electrodes on the base substrate respectively, and the plurality of second pixel defining layer units cover sidewalls of the plurality of first electrodes and separate adjacent first electrodes.

12. The method of claim 11, wherein forming the plurality of first pixel defining layer units and the plurality of second pixel defining layer units comprises:
   forming a second pixel defining layer film covering the plurality of first pixel defining layer sub-films;
   patterning the second pixel defining layer film and the plurality of first pixel defining layer sub-films with a second mask to form the plurality of first pixel defining layer units and the plurality of second pixel defining layer units,
   wherein at least one of the plurality of first pixel defining layer units comprises a hydrophilic side surface, and at least one of the plurality of second pixel defining layer units comprises a hydrophobic side surface.

13. The method of claim 11, wherein, forming the plurality of first pixel defining layer units and the plurality of second pixel defining layer units comprises:
   forming a second pixel defining layer film;
   patterning the second pixel defining layer film and the plurality of first pixel defining layer sub-films with two different masks to form the plurality of first pixel defining layer units and the plurality of second pixel defining layer units,
   wherein at least one of the plurality of first pixel defining layer units comprises a hydrophilic side surface, and at least one of the plurality of second pixel defining layer units comprises a hydrophobic side surface.

14. The method of claim 11, wherein the plurality of first pixel defining layer units and the plurality of second pixel defining layer units define a plurality of openings; the plurality of openings overlap the plurality of first electrodes respectively.

15. The method of claim 14, further comprising:
   forming an organic emitting solution in the plurality of openings so that the organic emitting solution is in contact with both the hydrophilic side surface and the hydrophobic side surface;
   drying the organic emitting solution to form an organic emitting layer.

16. A display apparatus, comprising:
   the display substrate of claim 1;
   an organic emitting layer in at least one of the plurality of openings; and
   a second electrode on the organic emitting layer.

17. The display apparatus of claim 16, wherein a thickness of the organic emitting layer is smaller than or substantially the same as the maximum vertical distance from the point on the hydrophilic side surface to the first electrode.

* * * * *